United States Patent [19]

Richardson

[11] Patent Number: 5,029,305
[45] Date of Patent: Jul. 2, 1991

[54] METHOD AND APPARATUS FOR ERROR CORRECTION IN THERMOMETER CODE ARRAYS

[75] Inventor: Donald C. Richardson, Plano, Tex.

[73] Assignee: Texas Instruments Incorporated, Dallas, Tex.

[21] Appl. No.: 287,924

[22] Filed: Dec. 21, 1988

[51] Int. Cl.$^5$ ............................................. H03M 1/36
[52] U.S. Cl. .................................... 341/159; 341/64; 341/94; 341/96; 341/158; 341/160
[58] Field of Search .................... 341/64, 158, 159, 96, 341/160, 94

[56] References Cited

U.S. PATENT DOCUMENTS

| | | | |
|---|---|---|---|
| 4,591,825 | 5/1986 | Bucklen | 341/96 |
| 4,712,087 | 12/1987 | Traa | 341/118 |
| 4,733,220 | 3/1988 | Knierim | 341/64 |
| 4,774,498 | 9/1988 | Traa | 341/120 |
| 4,884,075 | 11/1989 | Mangelsdorf | 341/159 |

OTHER PUBLICATIONS

Yoshii et al.; "An 86 350 MHz Flash ADC"; IEEE Int. Solid-State Circuits Conference; pp. 96–97, Feb. 1987.
Woodward et al.; "A Monolithic Voltage-Comparator Away for A/D Converters"; IEEE J. Solid-State Circuits, vol. SC-10, pp. 392–399; Dec. 1975.
Gordon; "Linear Electric A/D Conversion Architectures, Their Origins, Parameters Limitations and Applications"; IEEE Transaction on Circuits and Systems; vol. CAS-25 7/78.
Peterson; "A Monolithic Video A/D Converter"; IEEE Solid-State Circuits; vol. SC-14, No. 6, pp. 932–937, Dec. 1979.
Fujita et al.; "A Bulk CMOS 20 MSIS Flash ADC", IEEE Int. Solid-State Circuits Conference; pp. 56–57, Feb. 1984.

Primary Examiner—Mark J. Reinhart
Assistant Examiner—Nancy Le
Attorney, Agent, or Firm—James T. Comfort; Melvin Sharp; B. Peter Barndt

[57] ABSTRACT

A method and apparatus for correcting errors in a thermometer code data array (32). A parallel A/D converter (22) comprises an array (26) of comparators and an encoder (30). The correction of errors in the data array (32) produced by the comparators (26) is accomplished by an array (24) of majority error correction gates which is placed between the array (26) of comparators and the encoder (30) in the A/D converter (22).

7 Claims, 4 Drawing Sheets

METHOD AND APPARATUS FOR ERROR CORRECTION IN THERMOMETER CODE ARRAYS

TECHNICAL FIELD OF THE INVENTION

This invention relates in general to the field of integrated electronic devices. Specifically, the present invention relates to a method and apparatus for correcting errors in analog-to-digital conversion circuits.

BACKGROUND OF THE INVENTION

In the fastest analog-to-digital (A/D) converters using conventional solid state circuits, an analog voltage to be converted is applied to a parallel array of converters for simultaneous comparison with a like number of reference voltages. The resulting output is digitally encoded into an output word. Parallel A/D converters use an array of analog comparators with respective reference voltages each separated from the others by the voltage equivalent of one least-significant bit (LSB). The array of these comparators is called a "thermometer code", because the outputs of the comparators which are coupled to reference voltages less than the input analog voltage will be set to one logical state while all of the outputs of the comparators which are coupled to reference voltages greater than the input analog voltage will be set to a different logical state. This thermometer code is coupled to digital encoding circuitry which detects the decision boundary between the two groups of outputs having different logical states and generates the appropriate digital code to be output by the converter.

The precision of the A/D converter is inversely dependent on the difference in voltage between the reference voltages of neighboring comparators. As designers have attempted to construct A/D converters of greater precision, the difference between the reference voltages of neighboring comparators has grown smaller and smaller. Voltage errors have thus become significant compared to the value of this difference in voltage. Errors in a parallel A/D converter can be caused by erroneous voltage offsets, component mismatching, noise, timing mishaps and many other causes. If the error inducing forces in the system are significant compared to one LSB, one or more of the comparators may produce erroneous outputs such that the data array of the comparator outputs is not in thermometer code form with a single decision boundary.

Previous attempts to correct these output errors have included the positioning of AND gates between the comparator output and the binary encoder. The AND gates each will have one extra input for error correction purposes. This method will correct a small class of thermometer code errors, but can result in an undesirable shifting of the decision boundary. Such a circuit is described by J. G. Peterson in "A Monolithic Video A/D Converter," *IEEE Journal of Solid State Circuits,* vol. SC-14, no. 6, Dec. 1979.

Other attempts to correct these errors have included dividing the comparators into groups and suppressing errors between the groups. Y. Yoshii et al., "An 8B 350 MHz Flash ADC," 1987 *IEEE International SolidStated Circuits Conference.* However, this method cannot correct general thermometer code errors throughout the data array.

Therefore, a need has arisen for a method and apparatus for correcting general thermometer code errors which does not shift the decision boundary of the thermometer code output, but which can detect and correct errors in the output of the entire comparator array.

SUMMARY OF THE INVENTION

In accordance with the present invention, an error correction circuit is provided for A/D convertors which substantially eliminates or reduces disadvantages and problems associated with prior error correction methods. More specifically, the present invention discloses a method and apparatus for error correction in thermometer code output arrays using majority logic circuits placed between the comparators output and the encoder. This arrangement has the technical advantage of being able to correct errors anywhere within the thermometer code output array without shifting the decision boundary. The majority circuit has as its input the comparator output to be corrected as well as a predetermined number of outputs from neighboring comparators. In one embodiment of the present invention, a single majority logic circuit is provided for each comparator in the A/D comparator array. Each majority circuit uses an odd number of inputs and has as its output a logical value equal to the logical value of the majority of its inputs.

In another embodiment of the present invention, a plurality of majority circuits are connected serially to provide for multiple stages of error correction. The first stage of error correction is coupled to the outputs of the A/D comparator array. The later stages of error correction have their inputs coupled to the outputs of the prior stage of error correction. Staging of the majority circuits provides the technical advantage of allowing the designer to select whatever level of precision is necessary for a particular circuit application.

A further technical advantage provided by the present invention is the flexibility of the number of inputs to each majority circuit in an error correction stage. A circuit designer can gain added precision by increasing the number of inputs into each majority circuit. The circuit designer can therefore select the number of inputs necessary for the correction of a predicted number and frequency of errors in the A/D comparator array.

BRIEF DESCRIPTION OF THE DRAWINGS

A more complete understanding of the present invention may be acquired by referring to the detailed description and claims when considered in connection with the accompanying drawings, wherein:

DETAILED DESCRIPTION OF THE INVENTION

Figure 1:
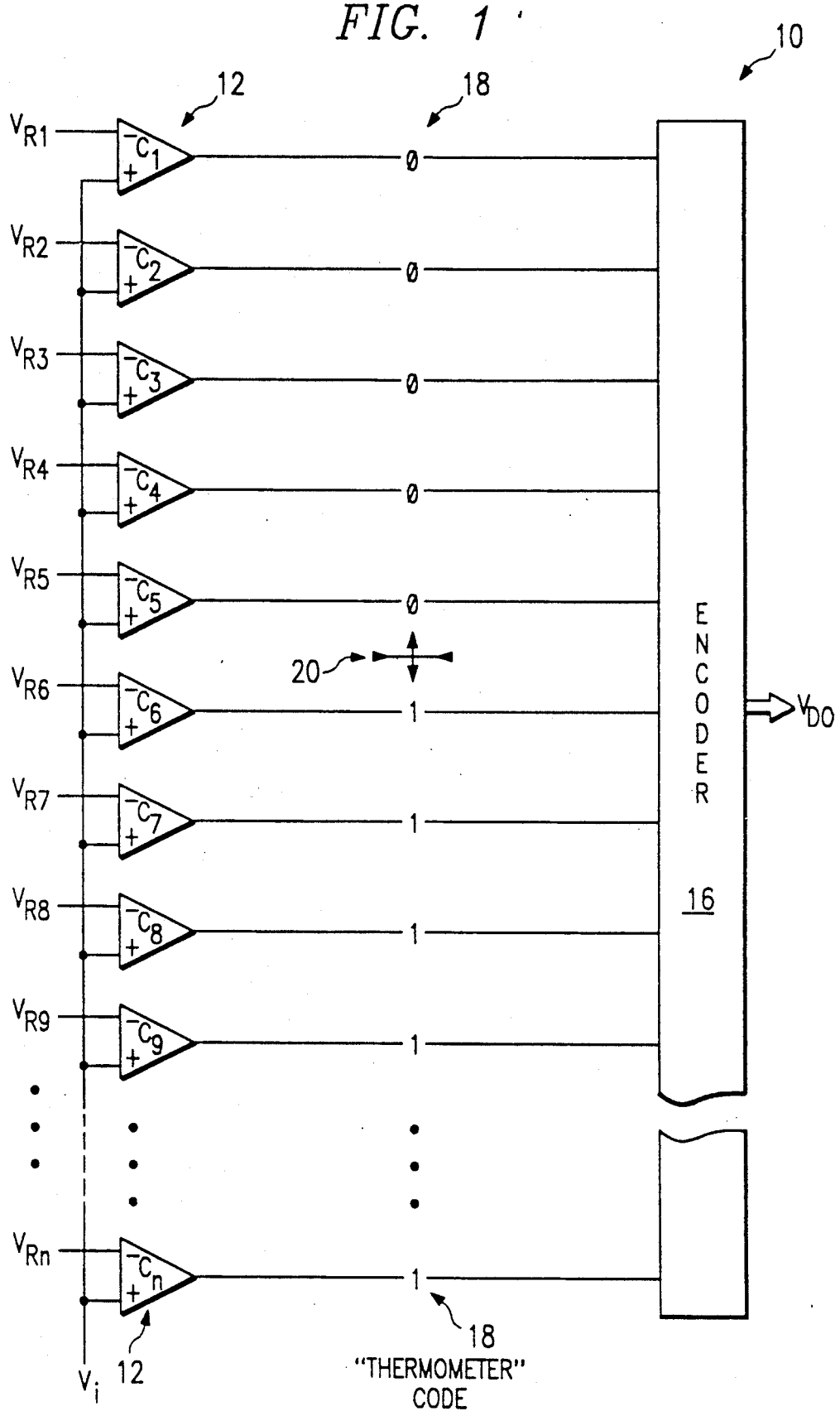
FIG. 1 is a schematic representation of a typical parallel A/D converter showing an error free "thermometer" code output having a characteristic single decision boundary.

FIG. 1 is a schematic representation of a typical prior art parallel A/D converter indicated generally at 10. A/D converter 10 comprises a plurality of comparators $C_1$ through $C_n$, indicated generally at 12. Comparators 12 each have one input coupled to a common analog input voltage $V_i$ and one input coupled to a particular reference voltage $V_{Rn}$. The outputs of comparators 12 are coupled to an encoder 16.

In operation, an analog voltage is applied to the comparators 12 at $V_i$ and each comparator $C_n$ will compare the voltage $V_i$ to the voltage level of its particular reference voltage $V_{Rn}$. The output of a particular comparator $C_n$ depends on whether the input voltage $V_i$ is greater than its particular reference $V_{Rn}$. The output of each comparator $C_n$ will be set to a logical value of "1" or "0" depending upon the value of input voltage $V_i$. This results in a comparator output array, indicated generally at 18, which is referred to as a "thermometer" code. The name "thermometer" code refers to the appearance of the array as input voltage $V_i$ fluctuates. As input voltage $V_i$ changes, the decision boundary, indicated generally at 20, between the group of outputs set to logical 1 and the group of outputs set to logical 0 will fluctuate in a manner similar to a thermometer.

The thermometer code 18 is input into a digital encoder 16 which outputs an encoded digital signal $V_{DO}$. Thus, an analog input voltage $V_i$ is converted to a digitally encoded value $V_{DO}$ by applying the voltage $V_i$ to the comparators 12, which in turn simultaneously compare the level of voltage $V_i$ to a particular reference voltage $V_{Rn}$ and output a logical 1 or 0 depending on the result of the comparison.

The precision of parallel A/D converter 10 depends on the speed at which it can sample input voltage $V_i$ and the difference in value between a particular reference voltage $V_{Rn}$ and its neighboring reference voltages $V_{R(n-1)}$ and $V_{R(n+1)}$. Typical applications of parallel A/D converters require that the difference in reference voltage be on the order of 20 millivolts. The smaller the difference in neighboring reference voltages, the greater the precision of the parallel A/D converter. However, the smaller the difference in reference voltages becomes, the more susceptible the converter becomes to errors Small voltage fluctuations, system noise, power supply fluctuations, and a variety of other factors can result in erroneous outputs from a particular comparator $C_n$. Additionally, the faster the sampling rate, the more likely it is for a comparator to output an erroneous logical value due to transient values resulting from timing errors.

If these errors are present in the outputs of the comparators 12, the thermometer code 18 will not have a single discrete decision boundary 20. Without a single decision boundary 20 in the thermometer code 18, encoder 16 is left with ambiguous input data. Therefore, a need exists for a method and apparatus for correcting erroneous values output from the comparators 12 which can return the erroneous output of the comparators 12 to the characteristic format of thermometer code 18 with a single decision boundary 20 as shown in FIG. 1.

Figure 2:
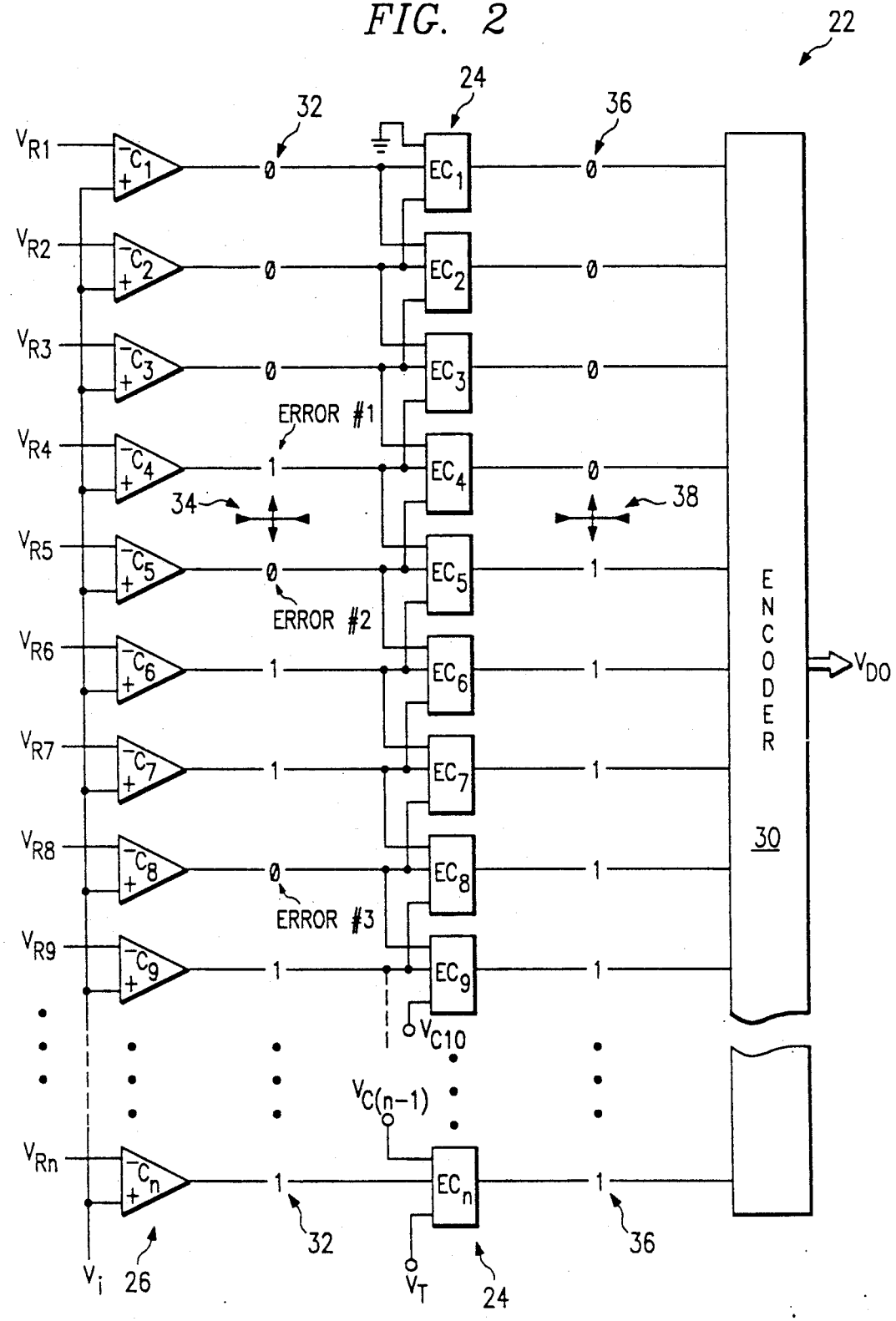
FIG. 2 is a schematic representation of a parallel A/D converter using majority error correction gates.

FIG. 2 is a schematic diagram of a parallel A/D converter according to the invention, and indicated generally at 22. A/D converter 22 is identical to A/D converter 10 shown in FIG. 1 except that it includes a majority error correction gate array indicated generally at 24.

Majority error correction gate array 24 comprises a plurality of majority error correction gates $EC_1$ through $EC_n$. Each majority error correction gate $EC_n$ has three digital inputs and one digital output. For each error correction gate $EC_n$, the logical level of its digital output is equal to the logical level of the majority of its three digital inputs. For example, if a particular majority error correction gate $EC_n$ had two logical 1's and one logical 0 at its inputs, its output would be a logical 1.

As shown in FIG. 2, there is the same number of gates in majority error correction gate array 24 as there are comparator gates 26. Similar to converter 10 shown in FIG. 1, comparator gates 26 are jointly coupled to input voltage $V_i$ and individually coupled to reference voltages $V_{R1}$ through $V_{Rn}$. The outputs of majority error correction gates 24 are coupled to encoder 30, which in turn outputs a digitally encoded signal $V_{DO}$.

Each of the majority error correction gates 24 is similarly connected to the comparators 26. An exemplary majority error correction gate $EC_7$ has one of its inputs coupled to the output of comparator $C_7$. The remaining inputs of majority error correction $EC_7$ are connected to the outputs of comparators $C_6$ and $C_8$. As a result, the logical value of the output of majority error correction gate $EC_7$ is equal to the logical level of the majority of the outputs of comparators $C_6$, $C_7$, and $C_8$.

As shown in FIG. 2, comparator $C_6$ has a logical output level of 1, comparator $C_7$ has a logical output of 1, and comparator $C_8$ has an erroneous output of a logical level of 0 which is labeled as ERROR #3. Since two of the three inputs to majority error correction gate $EC_7$ are logical 1s, the output $EC_7$ is a logical 1.

An erroneous comparator output array is indicated generally at 32. A hypothetically correct decision boundary is indicated generally at 34. For this example, the hypothetical level of analog input voltage $V_i$ rests between reference voltage $V_{R4}$ and reference voltage $V_{R5}$.

The erroneous comparator output array 32 contains three errors. The output of comparator $C_4$ is shown as a logical level 1 when it should be a logical level 0, as reference voltage $V_{R4}$ is hypothetically greater than input voltage $V_i$. The output of comparator $C_4$ is therefore labeled ERROR #1. The output of comparator $C_5$ is shown as a logical 0. This is also in error as the hypothetical value of input voltage $V_i$ is lower than reference voltage $V_{R5}$, and therefore the output of comparator of $C_5$ should be a logical 1. The output of comparator $C_5$ is therefore labeled ERROR #2.

The output of comparator $C_8$ is also erroneous as it is shown to be a logical 0. This output should be a logical 1 as the hypothetical value of input voltage $V_i$ is below the voltage level of reference voltage $V_{R8}$. The output of comparator $C_8$ is therefore labeled ERROR #3.

Due to the presence of ERROR #1, ERROR #2 and ERROR #3, it is impossible to discern the location of the hypothetical decision boundary 34 solely by examining the logical values contained in array 32. This ambiguity is not present in the ideal thermometer code 18 shown in FIG. 1.

The location of ERROR #1, ERROR #2, and ERROR #3 are shown merely by way of example. Similar errors could occur anywhere in comparator array 26 due to the variety of causes which have been discussed previously.

In operation, the correction of ERROR #1 is accomplished by majority error correction gate $EC_4$. Majority error correction gate $EC_4$ has its inputs coupled to the outputs of comparators $C_3$, $C_4$ and $C_5$. These outputs are set to a logical 0, a logical 1 and a logical 0, respectively. As two of the three inputs are set to a logical 0, the output of majority error correction gate $EC_4$ is set to a logical 0. Thus, through the operation of majority error correction gate $EC_4$, ERROR #1 is corrected by changing its logical value from a logical 1 to a logical 0.

The correction of ERROR #2 is accomplished by majority error correction gate $EC_5$. The inputs to majority error correction gate $EC_5$ are the outputs of comparators $C_4$, $C_5$ and $C_6$. These outputs are set to a logical 1, a logical 0 and a logical 1, respectively. As two of the three inputs are set to a logical 1, the output of majority error correction gate $EC_5$ is a logical 1. The correction of ERROR #3 is accomplished by majority error correction gate $EC_8$ in a similar manner.

The corrected array of logical outputs of the majority error correction gates 24 forms a corrected thermometer code which is indicated generally at 36. The corrected thermometer code 36 is in an appropriate form for operation by the encoder 30 with a single discrete decision boundary 38. The inclusion of majority error correction gates 24 corrects the erroneous comparator output array 32 which contained multiple ambiguous decision boundaries where the output array 32 changed from one logical state to another. The corrected thermometer code 36 contains only a single decision boundary 38, thereby eliminating any ambiguity from the input to encoder 30.

The error correction gates $EC_1$ and $EC_n$, forming respective ends of the majority error correction gate array 24, each have one extra input, that is, an input not derived from the output comparators 26. Majority error correction gate $EC_1$ has its extra input coupled to voltage level equivalent to a logical 0 due to its location in array 24. Majority error correction gate $EC_n$ has its extra input coupled to a voltage level equivalent to a logical 1 due to its location in array 24.

In a majority error correction array comprising majority error correction gates having a greater, odd number of inputs, the gates on each end of the array would have a correspondingly greater number of extra inputs coupled to appropriate voltage levels. Further, in such an array, gates near the ends of the array would also have extra inputs coupled to appropriate voltage levels. For example, in an array which used majority error correction gates with five inputs, the gates on each end of the array would have two extra input and the next to last gates in the array would each have one extra input.

An alternate embodiment of the present invention includes majority error correction gates on or near the ends of the gate array which do not have extra inputs. These gates are designed such that their internal logic automatically factors in their position in the gate array. For example, in a majority error correction a gate array using gates with three inputs throughout the rest of the array, the majority error correction gates at each end of the array would have only two inputs. The design of these gates would be such that when one of their inputs was logical 1 and the other was logical 0, they would break the tie in favor of the most probable value for their respective end of the array. Similar majority error correction gates with fewer inputs and similar tie-breaking functionality are used for majority error correction gate arrays using gates with a greater number of inputs.

Figure 3A:
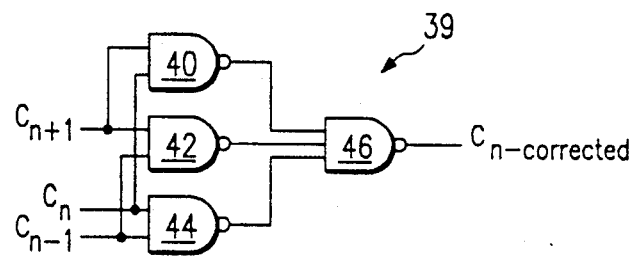
FIG. 3a is a schematic representation of an exemplary prior art three input majority circuit implementation using NAND gates.
Figure 3B:
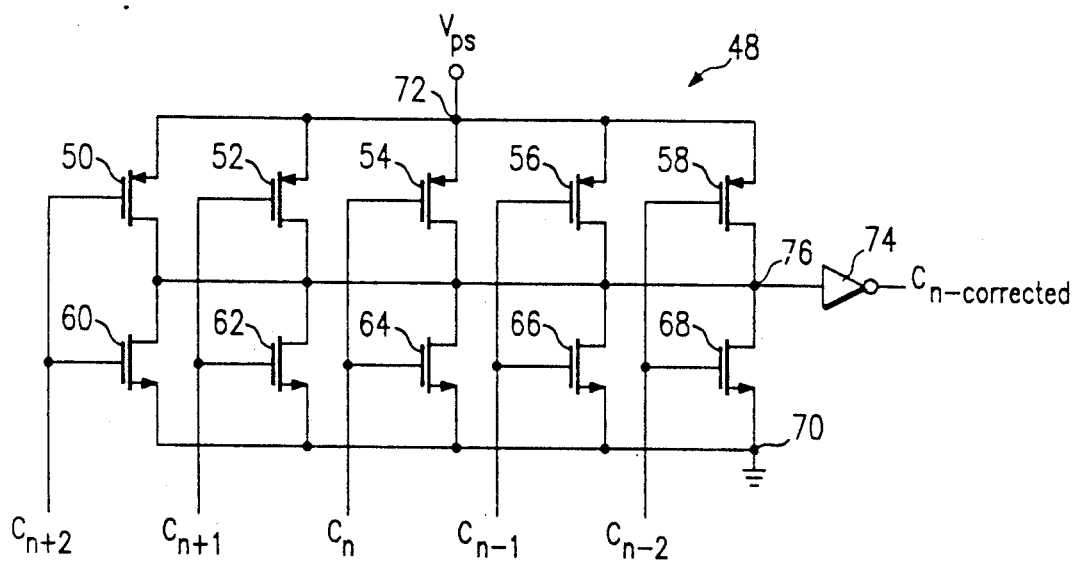
FIG. 3b is a schematic representation of an exemplary prior art five input analog majority circuit implementation.

FIGS. 3a and 3b are schematic circuit diagrams of exemplary implementations which will accomplish the functions required of a single majority error correction gate. The majority error correction circuit indicated generally at 39 in FIG. 3a has three inputs. The input $C_n$ is coupled to the output of the comparator to which the majority error correction gate is associated. The inputs $C_{n+1}$ and $C_{n-1}$ are coupled to the outputs of neighboring comparators in the comparator array. Within circuit 39, the input $C_{n+1}$ is coupled to a first dual input NAND gate 40. The input $C_{n+1}$ is also coupled to one of the inputs of a second dual input NAND gate 42. The input $C_n$ is coupled to the remaining input of first dual input NAND gate 40, and one of the inputs of a third dual input NAND gate 44. The input $C_{n-1}$ is coupled to the remaining input of second dual input NAND gate 42 and the remaining input of third dual input NAND gate 44. The outputs of first dual input NAND gate 40, second dual input NAND gate 42 and third dual input NAND gate 44 are coupled to respective inputs of a NAND gate 46. The output of the three input NAND gate 46 is labeled in FIG. 3a as $C_{n\text{-}corrected}$. The logical value of $C_{n\text{-}corrected}$ is equal to the logical value of the majority of inputs $C_{n+1}$, $C_n$ and $C_{n-1}$.

FIG. 3b illustrates a CMOS analog circuit which implements the majority error correction gate function for a circuit application requiring five inputs. A circuit designer may use the teachings of the present invention to gain added precision in a majority error correction gate implementation by increasing the number of inputs to each majority error correction gate.

The implementation shown in FIG. 3b has five inputs $C_{n+2}$, $C_{n+1}$, $C_n$, $C_{n-1}$ and $C_{n-2}$. The CMOS circuit indicated generally at 48 is expandable to any odd number of inputs required by a particular circuit application. A majority circuit implementation must have an odd number of inputs to insure that there is never an equal number of logical 0 and logical 1 inputs.

CMOS circuit 48 includes five P-channel field effect transistors 50, 52, 54, 56 and 58 and five further N-channel field effect transistors (FETs) 60, 62, 64, 66 and 68. Circuit 48 is coupled to ground at a node 70, and coupled to a power supply voltage $V_{ps}$ at a node 72. The corrected logic signal $C_{n\text{-}corrected}$ is output from circuit 48 through an inverter 74 which is coupled to an output node 76.

P-channel FET 50 has its gate coupled to input $C_{n+2}$, its source connected to node 72 and its drain connected to output node 76. N-channel FET 60 has its gate coupled to the gate of FET 50 and input $C_{n+2}$. FET 60 further has its drain connected to node 70 and its source connected to output node 76. P-channel FET 52 has its gate connected to input $C_{n+1}$, its source connected to node 72 and its drain connected to output node 76. N-channel FET 62 has its gate connected to the gate of FET 52 and input $C_{n+1}$. FET 62 has its source connected to output node 76 and its drain connected to node 70. P-channel FET 54 has its gate coupled to input $C_n$, its source coupled to node 72 and its drain coupled to output node 76. N-channel FET 64 has its gate coupled to the gate of FET 54 and input $C_n$. FET 64 has its source coupled to output node 76 and its drain coupled to node 70. P-channel FET 56 has its gate coupled to input $C_{n-1}$, its source coupled to node 72 and its gate coupled to output node 76. N-channel FET 66 has its gate coupled to the gate of FET 56 and input $C_{n-1}$ FET 66 has its source coupled to output node 76 and its drain coupled to node 70. P-channel FET 58 has its gate coupled to input $C_{n-2}$, its source coupled to node 72 and its drain coupled to output node 76. N-channel FET 68 has its gate coupled to the gate of FET 58 and input $C_{n-2}$ FET 68 has its source coupled to output node 76 and its drain coupled to node 70.

In operation, voltage levels near that of node 72 represent a logical level of "1" and voltage levels near that of node 70 represent a logical level of "0". A logical level of "0" applied to input $C_{n+2}$ will render FET 50 conductive, whereas a logical level of "1" applied to input $C_{n+2}$ will render FET 60 conductive. Similarly, the logical level of the other inputs determines whether the N-channel or P-channel field effect transistor that each is associated with is rendered conductive. The FETs in this circuit are sized so that if more P-channel FETS are made conductive than N-channel FETs, the voltage level of output node 76 will be near to that of node 72 and will be accepted by inverter 74 as a logical level of "1" However, if more N-channel FETs are made conductive than P-channel FETs, the voltage level of output node 76 will be near that of node 70 and will be accepted by inverter 74 as a logical level of "0". Thereby, the logical level of the majority of inputs determines the logical level of output node 76, which when inverted by inverter 74, results in the output logical signal $C_{n\text{-}corrected}$.

The prior art majority circuit implementations shown in FIGS. 3a and 3b are merely exemplary. There are a variety of other circuit implementations which can accomplish the same majority logical function required for implementation of the present invention. Therefore, the presentation of exemplary majority circuit implementations should not be construed to limit the scope of the invention to any particular circuit implementation.

Figure 4:
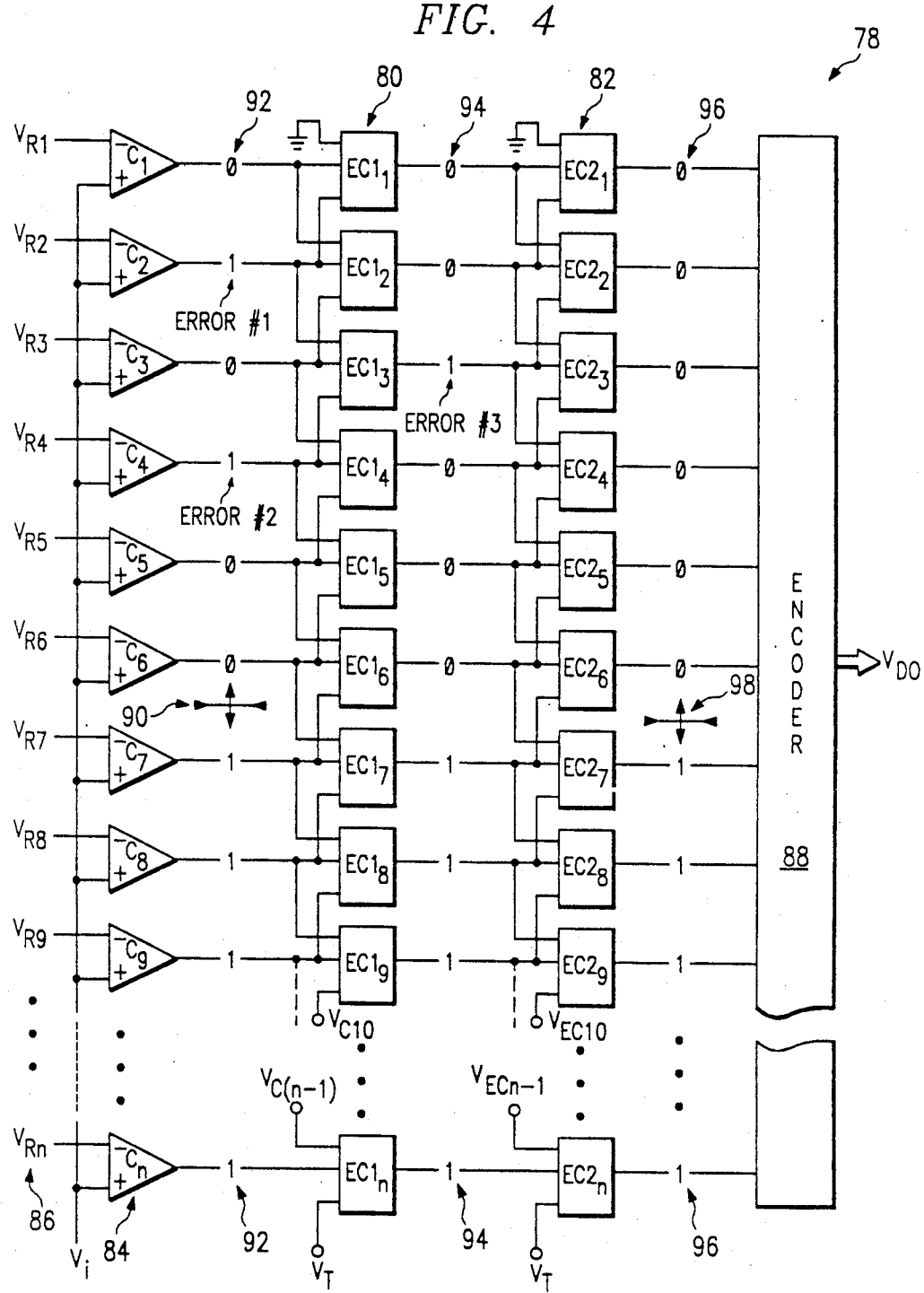
FIG. 4 is a schematic representation of a parallel A/D converter using two majority error correction stages.

FIG. 4 is a schematic electrical diagram of a parallel A/D converter circuit indicated generally at 78 which demonstrates a further embodiment of the present invention. The parallel A/D circuit 78 includes multiple stages of majority error correction gate arrays which are indicated generally at 80 and 82. The circuit further comprises an array of comparators, indicated generally at 84, which have as their inputs a series of reference voltages $V_{Rn}$ indicated generally at 86, and an analog voltage $V_i$. The output of second majority error correction gate array 82 is coupled to an encoder 88. The inputs of any non-end gate $EC2_m$ ($1 < m < n$) of second majority error correction gate array 82 are coupled to the outputs of first majority error correction gates $EC1_{m-1}$, $EC1_m$ and $EC1_{m+1}$ in array 80. The inputs of any non-end gate $EC_m$ ($1 < m < n$) of first majority error correction gate array 80 are coupled to the outputs of comparators $C_{m-1}$, $C_m$ and $C_{m+1}$ in comparator array 84. As was discussed with reference to the error correction array 24 shown in FIGURE 2, there are an equal number of majority error correction gates in each majority error correction gate stage as there are comparators. End gates $EC1_1$ and $EC2_1$ have one input apiece coupled to ground, and end gates $EC1_n$ and $EC2_n$ each have one input coupled to $V_+$.

For purposes of teaching the present invention, the level of a hypothetical analog input voltage $V_i$ resides between reference voltages $V_{R6}$ and $V_{R7}$. This creates an ideal decision boundary 90 between individual comparators $C_6$ and $C_7$. In the ideal case, all the logical values of individual comparators $C_7$ through $C_n$ would be set to a logical 1 and all the values of comparators $C_1$ through $C_6$ would be set to a logical 0. This condition would create a perfect thermometer code output array with a characteristic single decision boundary at 90. However, for the purpose of teaching the present invention, errors have been introduced into the comparator output array which is indicated generally at 92. The output of comparator $C_2$ is shown to be a logical one and is labeled ERROR #1. The output of comparator $C_4$ is shown also to be a logical 1 and is labeled ERROR #2.

ERROR #1 shown on FIG. 4 is corrected by majority error correction gate $EC1_2$ using the majority logic implementations discussed previously. ERROR #2 is corrected by majority error correction gate $EC1_4$ in a similar manner. However, an intermediate ERROR #3 is created by the close proximity of ERROR #1 to ERROR #2 in the original erroneous comparator output array 92. ERROR 190 3 appears at the output of majority error correction gate $EC1_3$. An intermediate erroneous output array, indicated generally at 94, does not contain a single decision boundary and is therefore not in the ideal thermometer code format.

The inclusion of a second stage of error correction comprising second majority error correction gate array 82 solves the problem of intermediate ERROR #3. As shown in FIG. 4, majority error correction gate $EC2_3$ corrects ERROR #3 and creates an appropriate thermometer code output array indicated generally at 96.

The format of corrected thermometer code output array is appropriate for input into encoder 88 and does not contain any ambiguities or erroneous decision boundaries.

The embodiment of the present invention shown in FIG. 4 contains two stages of error correction gates. However, for any particular circuit application more stages of error correction could be employed depending upon the expected concentration of errors in the original output of the comparator array. The illustration of the dual stage error correction scheme shown in FIG. 4 is presented solely for the purpose of teaching the present invention and should not be read to limit the scope of the present invention to any number of error correction stages or any particular error correction circuitry implementation.

Through the flexibility inherent in the present invention in the selection of the number of inputs into each majority error correction gate and the number of majority error correction gate array stages, a circuit design can provide for any degree of precision necessary for a particular application.

Further, a single A/D converter may contain different error correction schemes within the same comparator array. For example, if the circuit architecture indicates that errors caused by noise, voltage fluctuations or other error inducing factors will more likely be present in a particular spot in the comparator array, a circuit design could provide for greater error correction in only a portion of the comparator array. In this alternative embodiment, a circuit would include a greater number of inputs or a greater number of stages for a discrete number of more vulnerable comparator outputs. The same circuit would provide a smaller number of inputs or a smaller number of error correction stages in other portions of the same comparator array.

The foregoing description uses preferred embodiments to illustrate the present invention. However, changes and modifications may be made in these embodiments without departing from the scope and spirit of the present invention, which are defined by the claims which follow.

What is claimed is:

1. A circuit for correcting errors in an uncorrected thermometer code data entry array, comprising:
   (a) inputs for inputting the logical value of an entry in the data entry array and the values of a plurality of neighboring entries in the data entry array;
   (b) a plurality of majority logic circuits, each of said majority logic circuits corresponding to a different entry in said data array and coupled to said inputs for calculating a corrected logical value equal too the logical value of a majority of an odd number of said inputs; and
   (c) an output of said majority logic circuit for outputting a corrected data entry having said corrected logical value;
   (d) said majority logic circuits including a first majority logic circuit corresponding to a first entry in the data entry array, at least one input of said first majority logic circuit coupled to a voltage source representative of a logical level of said first entry; and
   (e) a last majority logic circuit corresponding to a least entry in the data entry array, at least one input of said last majority logic circuit coupled too a voltage source representative of a logical level of said last entry;
   (f) wherein a first majority logic circuit of said second stage corresponds to an output of a first majority logic circuit of said first stage, said first majority logic circuit of said first stage corresponding to a first entry in the data entry array,, at least one input of both of said first majority logic circuits coupled to a voltage source representative of a logical level of said first entry; and
   (g) a last majority logic circuit of said second stage corresponding to an output of a last jajority logic circuit of said first stage, said last majority logic circuit of said first stage corresponding to a last entry in the data entry array, at least on input of both of said last jajority logic circuits coupled to a voltage source representative of a logical level of said last entry.

2. A circuit for correcting errors in an uncorrected thermometer code data entry array, comprising:
   inputs for inputting the logical value of an entry in the data entry array and the values of a plurality of neighboring entries in the data entry array;
   a first plurality of majority logic circuits, each of said first plurality of majority logic circuits corresponding to a different entry in said data array and coupled to said inputs for calculating a first corrected logical value equal to the logical value of a majority of an odd number of said inputs;
   outputs of said first plurality of majority logic circuits for outputting a first corrected data entry having first corrected logical values;
   a second plurality of majority logic circuits, each of said second plurality of majority logic circuits corresponding to a different output of said first plurality of majority logic circuits and coupled to said outputs for calculating a second corrected logical value equal to the logical value of a majority of an odd number of said outputs of said first plurality of majority circuits; and
   outputs of said second plurality of majority logic circuit for outputting a second corrected data entry having second corrected logical values.

3. The circuit of claim 2 wherein said first plurality of majority logic circuits includes a first majority logic circuit corresponding to a first entry in the data entry array, at least one input of said first majority logic circuit coupled to a voltage source representative of a logical level of said first entry and a last majority logic circuit corresponding to a last entry in the data entry array, at least one input of said last majority logic circuit coupled to a voltage source representative of a logical level of said last entry.

4. The circuit of claim 3 wherein said second plurality of majority logic circuits includes a second majority logic circuit corresponding too a first output, at least one input of said second majority logic circuit coupled to a voltage source representative of a logical level of said first output and a last majority logic circuit corresponding to a last output, at least one input of said last majority logic circuit coupled to a voltage source representative of a logical level of said last entry.

5. A method for correcting errors in an uncorrected thermometer code data entry array, comprising the steps of:
   inputting the logical value of an entry in the data entry array and the values of a plurallity of neighboring entries in the data entry array;
   providing a first plurality of majority logic circuits, each of said first plurality of majority logic circuits corresponding to a different entry inn said data array and coupled to said inputs for calculating a first corrected logical value equal to the logical value of a majority of an odd number of said inputs;
   providing outputs of said first plurality of majority logic circuits for outputting a first corrected data entry having first corrected logical values;
   providing a second plurallity of majority logic circuits, each of said second plurality of majority logic circuits corresponding to a different output of said first plurality of majority logic circuits and coupled to said outputs for calculating a second corrected logical value equal to the logical value of a majority of an odd number of said outputs of said first plurality of majority circuits; and
   providing outputs of said second plurality of majority logic circuit for outputting a second corrected data entry having second corrected logical values.

6. The method of claim 5 including providing said first plurality of majority logic circuits with a first majority logic circuit corresponding to a first entry in the data entry array, at least one input of said first majority logic circuit coupled to a voltage source representative of a logical level of said first entry and a last majority logic circuit corresponding to a last entry in the data entry array, at least one input of said last majority logic circuit coupled to a voltage source representative of a logical level of said last entry.

7. The circuit of claim 6 including providing said second plurality of majority logic circuits with a second majority logic circuit corresponding to a first output, at least one input of said second majority logic circuit coupled to a voltage source representative of a logical level of said first input and a last majority logic circuit corresponding to a last output, at least one input of said last majority logic circuit coupled to a voltage source representative of a logical level of said last entry.

* * * * *